US007850334B2

(12) United States Patent
Holder et al.

(10) Patent No.: US 7,850,334 B2
(45) Date of Patent: Dec. 14, 2010

(54) APPARATUS AND METHOD OF USING MULTIPLE LED LIGHT SOURCES TO GENERATE A UNITIZED BEAM

(75) Inventors: Ronald G. Holder, Laguna Niguel, CA (US); Greg Rhoads, Irvine, CA (US)

(73) Assignee: Illumination Management Solutions Inc., Irvine, CA (US)

(\*) Notice: Subject to any disclaimer, the term of this patent is extended or adjusted under 35 U.S.C. 154(b) by 371 days.

(21) Appl. No.: 12/095,473

(22) PCT Filed: Dec. 4, 2006

(86) PCT No.: PCT/US2006/046342

§ 371 (c)(1),
(2), (4) Date: May 29, 2008

(87) PCT Pub. No.: WO2007/067513

PCT Pub. Date: Jun. 14, 2007

(65) Prior Publication Data

US 2009/0310345 A1  Dec. 17, 2009

Related U.S. Application Data

(60) Provisional application No. 60/742,834, filed on Dec. 5, 2005.

(51) Int. Cl.
*B60Q 1/26* (2006.01)

(52) U.S. Cl. .................. 362/227; 362/234; 362/235; 362/240; 362/241; 362/249.02

(58) Field of Classification Search .............. 362/227, 362/230, 231, 234–237, 240, 241, 247, 249.01, 362/249.02
See application file for complete search history.

(56) References Cited

U.S. PATENT DOCUMENTS

| 4,355,348 | A | 10/1982 | Williams |
| 6,527,411 | B1 | 3/2003 | Sayers |
| 2003/0218880 | A1 | 11/2003 | Brukilacchio |
| 2004/0228131 | A1 | 11/2004 | Minano et al. |
| 2005/0036119 | A1 | 2/2005 | Ruda et al. |
| 2005/0243570 | A1 | 11/2005 | Chaves et al. |

OTHER PUBLICATIONS

International Searching Authority, The International Search Report and The Written Opinion for PCT/US06/46342 dated Feb. 20, 2008, 11 pages.

*Primary Examiner*—Sandra L O Shea
*Assistant Examiner*—Meghan K Dunwiddie
(74) *Attorney, Agent, or Firm*—King & Spalding LLP

(57) ABSTRACT

An LED package is comprised of a plurality of light emitting diodes (LED) of similar or differing wavelengths; a corresponding plurality of reflector cavities, a common combining chamber, and an integrating rod coupled to the combining chamber to provide a unitized beam at a common output aperture for the plurality of LEDs.

27 Claims, 7 Drawing Sheets

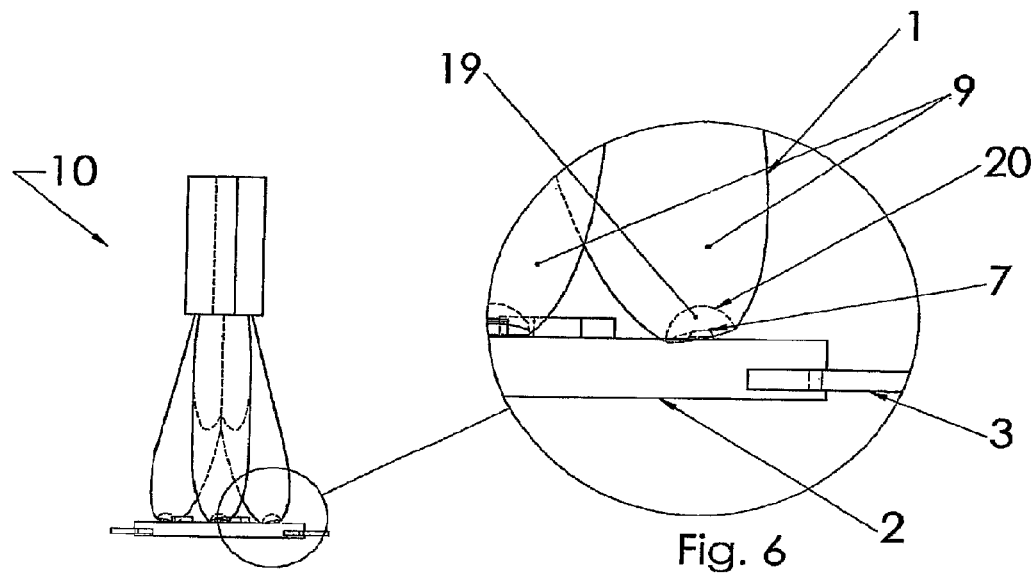
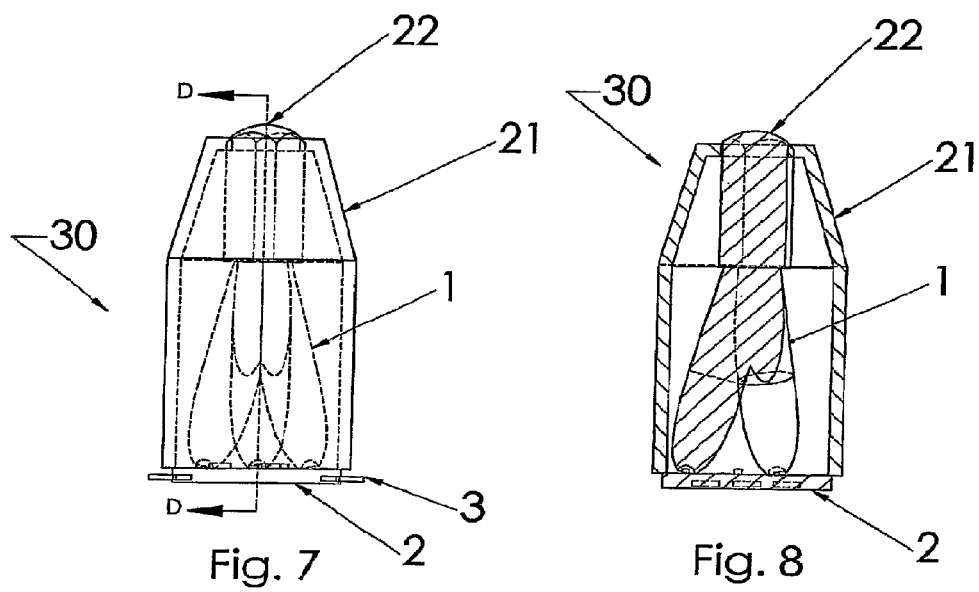

APPARATUS AND METHOD OF USING MULTIPLE LED LIGHT SOURCES TO GENERATE A UNITIZED BEAM

BACKGROUND OF THE INVENTION

1. Field of the Invention

The invention relates to the field of LED packaging and LED arrays comprised of a plurality of LED packages using color controlled LED's.

2. Description of the Prior Art

The typical LED package consists of an LED emitter, a lead frame to transfer electric current to the LED emitter, a thermal transfer means, which may also be the lead frame, possibly an encapsulant and a lens or protective dome, which may also be the encapsulant. A typical white LED is comprised additionally of a phosphor coating over a "blue" LED emitter. Much instruction in the prior art is dedicated to describing the processes for applying this phosphor to the blue LED.

Some LED packages are manufactured with three different colored LED emitters, most often red, green and blue, and provide a wide range of color, including white, when the emitters are controlled individually. The LED emitters are closely spaced and when seen from a distance appears to be one color. The problem with these devices, however, is when an optic is required on the device to narrow the beam, the rays of the resultant beam are split into separate beams which do not share the same angle space, because the sources are in different locations within the focus of the optic required to narrow the beam.

When applied to products, such as flood lights or backlight illumination, the resultant separation of color is at least annoying if not unacceptable. In a typical flood light, the perimeter of a spot projected on the wall will have a fringe of varying colors.

The typical solution to this color variance is to apply at least one layer of diffusing material in the beam to "homogenize" the light output. This usually results in a sever loss of light level and unwanted spreading and bleeding of light from the system.

What is needed is a controllable, combined light source which is not subject to the inherent disadvantages of such prior art.

BRIEF SUMMARY OF THE INVENTION

The illustrated embodiment of the invention uses light emitting diodes (LED) in a miniature LED package that combines the energy from multiple LEDs of similar or differing wavelengths into an approximate unitized beam. In the illustrated embodiment "unitized beam" means that the rays from the multiple LEDs are combined across a single aperture with similar light or energy distributions across the single aperture. A large scale example of a similar device is shown and described in U.S. patent application Ser. No. 11/228,164, filed on Sep. 15, 2005 and entitled "An Apparatus and Method of Using Led Light Sources to Generate a Unitized Beam" incorporated herein by reference and assigned to the same assignee as the present application. There are, however, design differences between the miniature LED package and the larger scale example, which are discussed below.

In addition, it must be understood that although the light from the multiple LEDs can be provided without qualitative differences across the aperture, i.e. they have substantially identical light or energy distributions across the single aperture, it is entirely within the scope of the invention that the each LED can be differently or independently modulated in frequency, distribution or intensity. As will be seen below, the light from three LED's is projected onto a common aperture each at a different angle in space, but at the same angle of declination. Therefore the plane of the common aperture will be inclined with respect to the wavefront from each LED beam and it is not to be expected that the energy distribution across the common aperture is symmetric or uniform with respect to any given LED beam. However, in the illustrated embodiment each LED is situated in approximately the same optical relationship with respect to the common aperture as are the other LEDs. This is not however to preclude the possibility that the optical relationship of each LED or a parameter of the LED beam might be qualitatively different from that of the other LEDs as measured at the common aperture. While the light at the aperture, when viewed directly on axis, appears to the human eye to be uniformly white, when viewed at an angle some color differences across the aperture may be visible and the projected light pattern will show a geometric color speckle if sufficiently magnified.

As described below, in one of the embodiments of the miniature LED package an integrating rod is integrally formed as part of the output optics with the miniature LED package to provide improved light by thorough mixing for each of the colors so that color aberrations do not occur. Thus, in one embodiment additional means, such as an optical integrator, is provided to more completely integrate the individual ray sets into a common beam or ray set.

The illustrated embodiment of the invention provides for the efficient collection of energy radiating from two or more LEDs, and then distributes this energy into a common aperture. The illustrated embodiment of the invention further includes thermal management of the LED package and contemplates electronic control of the individual LEDs.

By choosing different color outputs for the LEDs and since the LEDs are individually controllable, an embodiment of the invention may generally be used in a wide variety of applications as a generic source of selectively controllable colored light. In fact, if three LEDs are chosen, each with a primary color, almost any color of the visible spectrum can be provided across the aperture. It is also contemplated that light both in the ultraviolet and infrared could be similarly utilized in such applications where needed. Because the LED package is miniaturized, what is provided is a color controlled pixel element, including a controllable white pixel light source. A plurality of the color controlled pixel elements of the illustrated embodiment may be combined into a high density array to provide a controllable color pixel display.

One embodiment of the invention is a highly efficient miniature; LED package with an energy source, at least two LEDs and preferably three LED's and a corresponding number of reflector zones, a common combining or mixing zone communicated to the reflector zones, an optional integrating rod, either prismatic, such as triangular or square or rounded, a means for mounting each of the LEDs within or coupled to the reflector zones and optionally with an encapsulating or protective housing. The reflector zones and mixing zone are combined into an integral or monolithic body light-transmitting body with which the integrating rod and any optical terminations for the integrating rod may or may not also be integral or monolithic. In the preferred embodiment the reflector zones, mixing zone and integrating rod and any optical terminations for the integrating rod are combined into an integral or monolithic miniature body light-transmitting body. The LEDs are mounted on a heat conductive material that provides the thermal management for the LEDs.

The reflector zones are optimized for collection of the nearly hemispheric radiation pattern of each of the corresponding LEDs. They can be designed in such a way as to provide a beam whose ray set remains primarily within the angles of total internal reflection of the downstream optical surfaces and materials or within the numerical aperture (NA) or acceptance angle of each downstream optical device.

"Numerical aperture (NA)" is defined as the sine of the vertex angle of the largest cone of meridional rays that can enter or leave an optical system or element, such as an optic fiber, multiplied by the refractive index of the medium in which the vertex of the cone is located. The NA is generally measured with respect to an object or image point and will vary as that point is moved. For an optical fiber in which the refractive index decreases monotonically from $n_1$ on the axis to $n_2$ in the cladding, an expression of the extent of the fiber's ability to accept, in its bound modes, non-normal incident rays, is given by $NA=(n_1^2-n_2^2)^{1/2}$. In multimode fibers, the term equilibrium numerical aperture is sometimes used. This refers to the numerical aperture with respect to the extreme exit angle of a ray emerging from a fiber in which equilibrium mode distribution has been established. More colloquially, NA is defined as the sine of the radiation or acceptance angle of an optical fiber, multiplied by the refractive index of the material in contact with the exit or entrance face. This usage is approximate and imprecise, but is often encountered.

The more relevant physical concept in the illustrated embodiment is "acceptance angle", which is defined in fiber optics as half the vertex angle of that cone within which optical power may be coupled into bound modes of an optical fiber. The axis of the cone is collinear with the fiber axis, the vertex of the cone is on the fiber end-face, and the base of the cone faces the optical power source. The acceptance angle is measured with respect to the fiber axis. Rays entering an optical fiber at angles greater than the acceptance angle are coupled into unbound modes.

An objective of one class of embodiments of the design is to provide a resultant beam that provides a ray set that is within the N/A of many fiber optic systems for use in the medical and scientific fields. Other uses for an LED package of this type, a "fiber engine", are for architectural, entertainment, medical, and other commercial needs.

The reflector zone may have a common conic shape or not and may be faceted or dimpled or otherwise modified to provide a desired beam pattern. Any configuration or form of optical reflector now known or later devised can be equivalently employed, such as an internally reflective coated reflector zone or a solid molded optic with or without coating, commonly referred to as a "TIR" (Total Internal Reflection) optic. Therefore, while the preferred embodiment for the optical zones are solid bodies, it must be expressly understood that in each instance, open cavities may also be employed with our without internal or external reflective coatings. The centerline of the reflector zone is rotated off axis from the perpendicular of a shared aperture at approximately one-half of the acceptance angle of the fiber. The reflector zone is connected by a near cylindrical reflective zone to the shared aperture. This zone can be the Boolean intersection of the reflectors or the Boolean of an extension of each of the reflectors to a common aperture.

In a two LED system, two cavities would be rotated opposite the centerline and the near cylindrical zones would be truncated to allow the energy of each reflector zone to find the aperture. This near cylindrical zone, or when joined in a "combining zone", keeps the energy of each beam within the N/A of the fiber with the exception of a very small portion on the opposite side of the system centerline from the reflector zone.

Additionally the illustrated embodiments of the invention include an apparatus for generating a selected color of light comprising a plurality of light sources disposed in a housing, each radiating a color of light and a corresponding plurality of reflectors disposed in the housing. Each reflector is paired with a light source to reflect light from one of the plurality of light sources. The light sources and reflectors are arranged and configured to combine reflected light from the reflectors into a composite light beam from the plurality of light sources. The arrangement in the illustrated embodiment is comprised of three light sources, each disposed approximately 120 degrees about the system centerline.

The plurality of light sources generate a near full color spectrum of visible light, or more specifically green, blue and red light in selected amounts. The apparatus further comprising means for individually controlling the intensity of light from each of the light sources, such as conventional drive circuits coupled to the light sources. Other color primaries or bases, other than green, blue and red, may be substituted according to the application and effect desired to increase, decrease or change the number and type of color primaries or bases used for combining or composition, such as amber or yellow added as a fourth primary or base color to provide a larger spectrum of combined colored light. For example, a warm white LED light source with an enhanced yellow component (lower Kelvin scale) can be combined with a cold LED light source with an enhanced blue component (higher Kelvin scale) to provide a color controlled white light source. When using three white LEDs and mixing them to get a different color, each white LED uses a phosphor. In contrast in another embodiment of the invention a white pixel light source without the use or phosphors or a phosphorless white light pixel source is provided by mixing red, blue, and green light together through the LED package's optic. Each unit can also be comprised of multiple light sources of the same color spectrum for higher intensity.

The illustrated embodiments of the invention also include a method of providing and operating the apparatus described above.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

BRIEF DESCRIPTION OF THE DRAWINGS

FIG. 5 is a reduced view of FIG. 3 with a callout for the detailed view, FIG. 6.

FIG. 6 is the detailed view of the called-out portion FIG. 5 showing an LED and its associated cavity geometries.

FIG. 7 is a transparent side view with the addition of a protective housing and an optical termination or lens defined on the distal end of the integrating rod.

FIG. 8 is a cross sectional side view of the LED package shown in FIG. 7.

Figure 1:
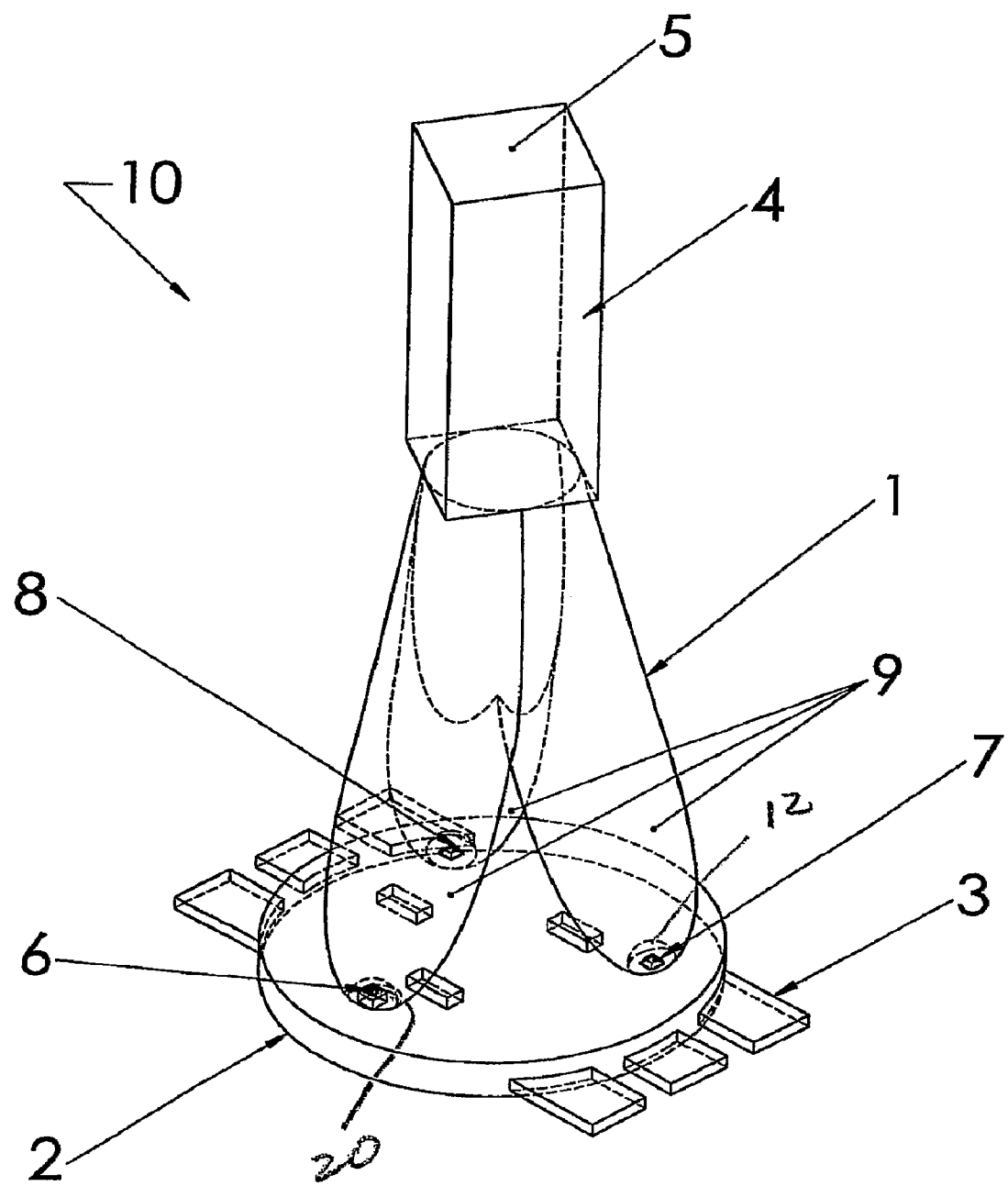
FIG. 1 is perspective transparent view of one embodiment of the invention in which three LEDs are used. A primary optic is in place with an optional integrating rod.

The components shown in the diagrams are the essential optical and elemental components to understand the invention. Omitted from the diagrams may be some electrical wires, housings, circuit boards, fasteners and other components that may be required, but are not essential to the understanding of the LED package.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

The invention relates to the field of apparatus and method for using light emitting diodes (LED) or other light sources of similar or differing wavelengths in an approximately unitized beam. A device of the invention would be generally described in the art as being an LED package. The invention has such broad usage for the field of lighting and illumination that only a fraction of its applications are described here by way of example. Usage would range from a single LED package used in a flashlight to an array of multiple LED packages used for large area displays, such as those found in a stadium. Additionally, an LED package or LED packages of the invention would be used as the source of illumination for thousands of products including general lighting, projection systems, television and computer backlight, automotive lighting, architectural, entertainment, landscape and outdoor lighting, medical applications, scientific and engineering applications, printers, scanners, computer controlled equipment of all sorts and so on nearly without limitation. The preferred embodiment contemplates a light source which is like an LED, namely having a hemispherical or nearly hemispherical light pattern. For purposes of the present disclosure, the term "LED" refers to any diode or combination of diodes that is capable of receiving an electrical signal and producing a color of light in response to the signal. Thus, the term "LED" as used herein should be understood to include light emitting diodes of all types (including semi-conductor and organic light emitting diodes), semiconductor dies that produce light in response to current, light emitting polymers, electro-luminescent strips, and the like. Furthermore, the term "LED" may refer to a single light emitting LED package having multiple semiconductor dies that are individually controlled. The term "LED" may refer to any type of non-packaged LEDs, surface mount LEDs, chip-on-board LEDs, and LEDs of all other configurations. The term "LED" also includes LEDs associated with other materials (e.g., phosphor, wherein the phosphor may convert radiant energy emitted from the LED to a different wavelength).

Additionally, as used herein, the term "light source" should be understood to include all illumination sources, including, but not limited to, LED-based sources as defined above, incandescent sources (e.g., filament lamps, halogen lamps), pyro-luminescent sources (e.g., flames), candle-luminescent sources (e.g., gas mantles), carbon arc radiation sources, photo-luminescent sources (e.g., gaseous discharge sources), fluorescent sources, phosphorescent sources, high-intensity discharge sources (e.g., sodium vapor, mercury vapor, and metal halide lamps), lasers, electro-luminescent sources, cathode luminescent sources using electronic satiation, galvano-luminescent sources, crystallo-luminescent sources, kine-luminescent sources, thermo-luminescent sources, triboluminescent sources, sonoluminescent sources, radioluminescent sources, and luminescent polymers capable of producing primary colors.

For purposes of the present disclosure, the term "light" should be understood to refer to the production of a frequency (or wavelength) of electromagnetic radiation by an illumination source (e.g., a light source). Furthermore, as used herein, the term "color" should be understood to refer to any frequency (or wavelength) of radiation within a spectrum; namely, "color" refers to frequencies (or wavelengths) not only in the visible spectrum, but also frequencies (or wavelengths) in the infrared, ultraviolet, and other areas of the electromagnetic spectrum. Similarly, for purposes of the present disclosure, the term "hue" refers to a color quality of radiation that is observed by an observer. In this sense, it should be appreciated that an observed hue of radiation may be the result of a combination of generated radiation having different wavelengths (i.e., colors), and may be affected by a medium through which the radiation passes before being observed (due to radiation absorption and/or scattering effects in the medium).

Figure 2:
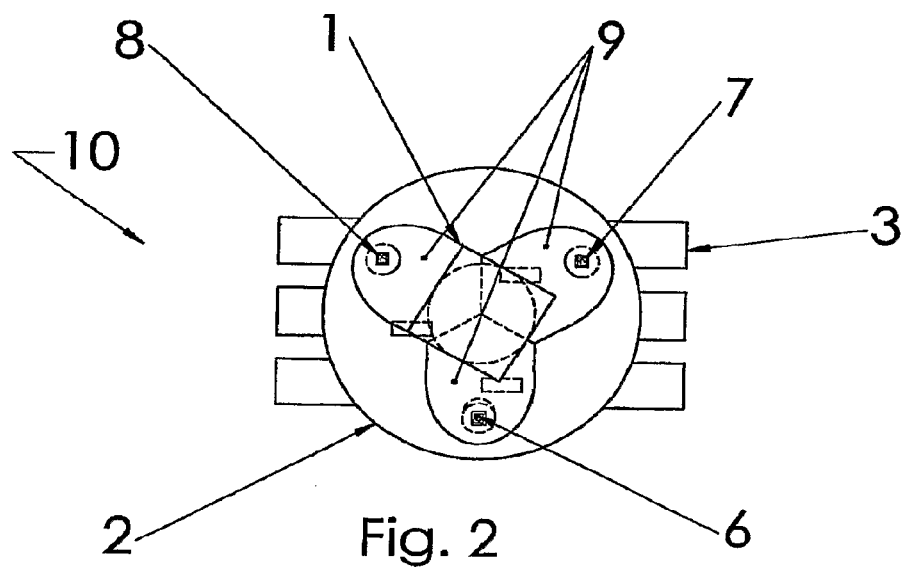
FIG. 2 is an top end plan view of the embodiment of FIG. 1.
Figure 3:
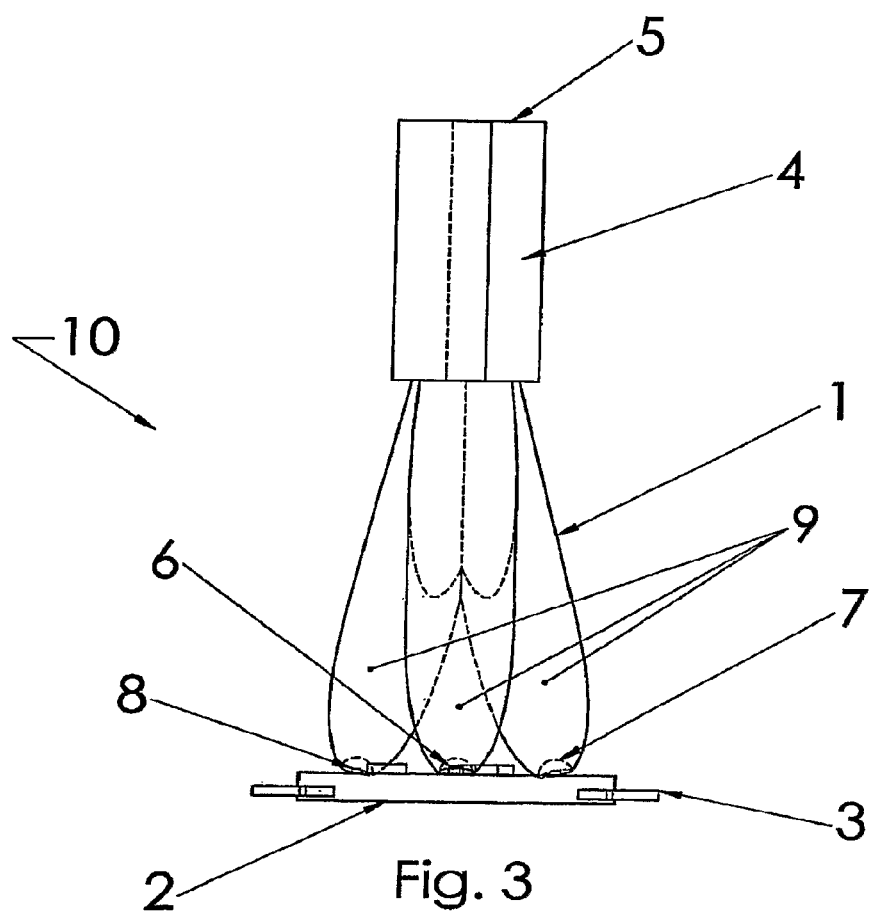
FIG. 3 is a side plan transparent view of the embodiment of FIG. 1.

Turn to FIGS. 1-3 wherein the illustrated embodiment of the optical portion of the invention is depicted. FIG. 1 shows the assembled LED package, generally denoted by reference numeral 10, which is comprised of an assembly of various elements described below. In the illustrated embodiment LED package 10 is comprised of a common base 2 onto which three legs of an integrated optic 1 are mounted like a tripod. Base 2 includes in the illustrated embodiment a circular mounting platform for LEDs 6, 7 and 8, a thermal heat sink (not shown), related electrical leads or connections 3 (some elements not shown) to LEDs 6, 7 and 8 and a conventional mechanical means of affixation to optic 1 of LED package 10.

In the preferred embodiment the integrated or monolithic optic 1 is molded as a solid transparent material with preferably hemispherical cavities 20 at or near the focal point of each of the reflector segments of the optic 1. These cavities 20 are intended to be filled with a transparent material that provides the best transmission of energy from the LEDs 6, 7, 8 to the reflective zone 33 shown in FIG. 4. Typically the material would be index matched to the material of the optic 1 and designed to provide the best extraction efficiency of the energy from the LEDs 6, 7, 8. Reflective zone 33 is devised so that it collects substantially all of the light radiated into the near hemispherical forward direction from LEDs 6, 7, 8 and directs substantially all of it into mixing zone 34 parallel to or nearly parallel to the longitudinal axis of mixing zone 34. The LEDs 6, 7, 8 are intended to be placed at or near the focal point of the reflector zone 33 of optic 1. The optional integrating rod 4, which could be round, square, triangular or any other cross-section that provides integration of the beams from the separate LEDs 6, 7, 8, which when properly designed, provides a nearly unitized beam at aperture 5 of integrating rod 4 LED package 10. The fewer the number of prismatic facets in rod 4, the greater the mixing which occurs per unit length. A common recognized length for an integrating rod 4 of this type has a length to width ratio of about 10:1. Shorter or longer ratios may be employed at the loss of optimization, if desired. Much shorter ratios will tend to have less mixing or integration of the light at surface 5. Much longer ratios provide no material gain in mixing or integration of the light at surface 5 and result only in greater optical losses, and larger package size. Other forms of integration, including the addition of thin films, lens arrays, lens systems, homogenizers, frosted plates, diffusion plates, optical scatterers, and the like, which either are now known or later devised.

In the illustrated embodiment each of the three lobes 9 shown of optic 1 are azimuthally equally spaced about aperture 5 of LED package 10, namely with the respective optical axis of each lobe 9 at approximately 120° azimuthal angular spacing. In addition, each lobe 9 has its optical axis inclined from perpendicular to aperture 5 at an angle of approximately 15°±3° declination or less. It is to be understood that the invention contemplates any diameter aperture 5 and scaling LED package 10 to conform to the N/A of the system required. For example, if an N/A for the system had a requirement of 40°, then the three lobes 98 of LED package 10 could be inclined at an angle of approximately 20° or less.

Figure 12:
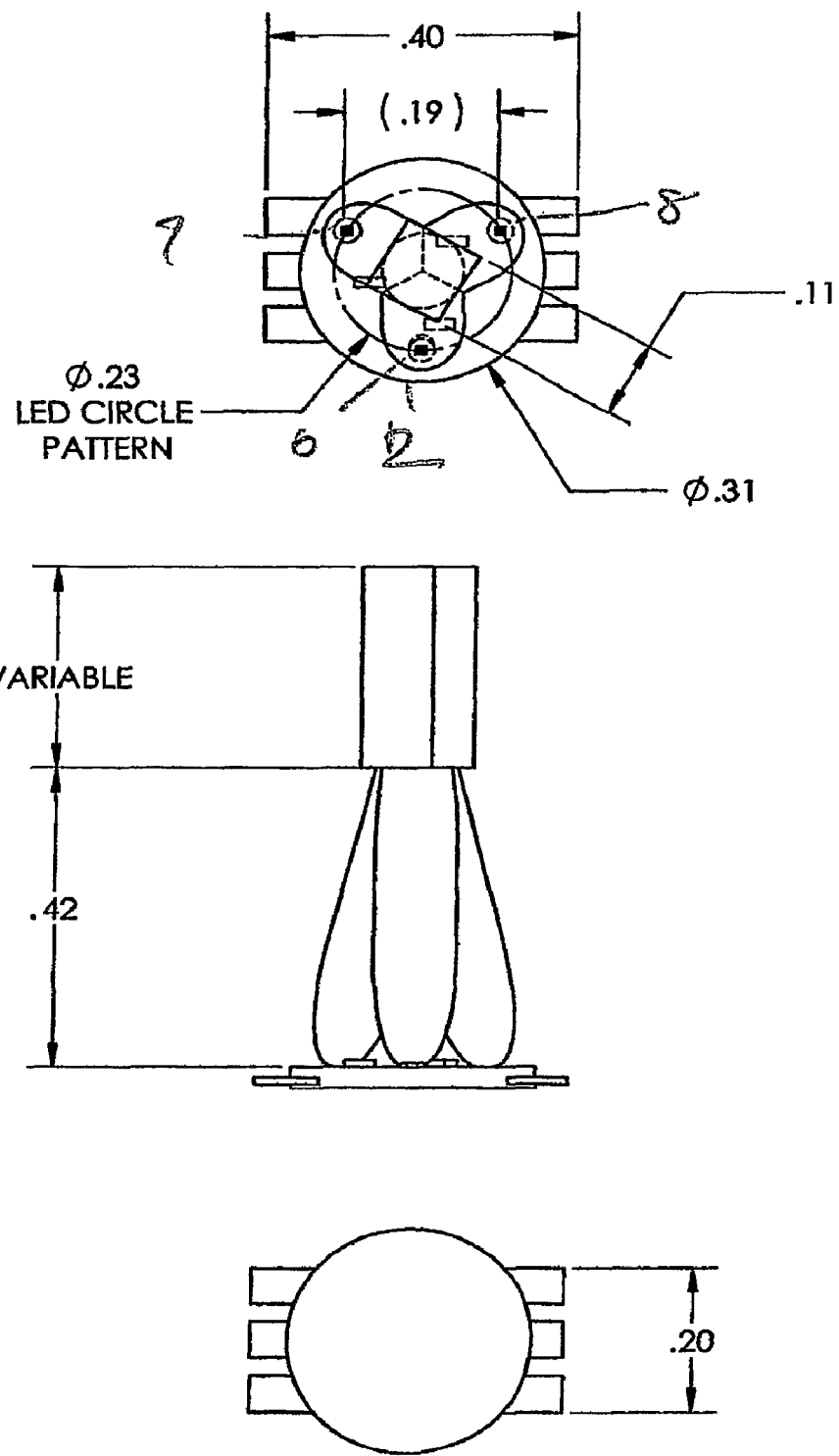
FIG. 12 is an embodiment of FIGS. 2 and 3 showing exemplary dimensions of one embodiment of the miniature LED package of the invention.

In the illustrated miniature embodiment as shown in FIG. 12 base 2 has a diameter illustratively given as approximately 0.31 inch, which LED emitters 6, 7, 8, lying equally spaced on a circle with a diameter of approximately 0.23 inch. This makes the chord distance between adjacent LED emitter 6, 7, 8 approximately 0.19 inch. Integrating rod 4 is shown a prism with a square cross section which is approximately 0.11 inch on a side, making the length of rod 4 preferably approximately 1.1 inch long, although the length is variable according to the degree of integration required. The overall length of optic 1 is approximately 0.42 inch. The sizing is only provided as an example of the degree of miniaturization which can be realized giving a color controllable pixel LED package 10 that is about the length of the metal collar holding an eraser onto the end of a standard #2 pencil, but with a smaller diameter than the pencil. This size is many orders larger than the wavelength of light, so that it is expressly contemplated that the structure of LED package 10 can be made smaller still before becoming optically limited. Microminiaturization is thus contemplated using MEMS fabrication techniques to provide an integrated array of packages 10 such as shown in concept in FIG. 10.

The construction shown in FIGS. 1-3 is described for clarity and is described in the claims, but is not the only way in which the various embodiment of the invention may be realized. For instance, the reflector lobes 9 can be made as separate components and then joined together into a single component. The reflector zones 35 and mixing zone 34 can be a solid molded component with or without an externally applied reflective coating with or without monolithic construction with integrating rod 4.

Figure 4:
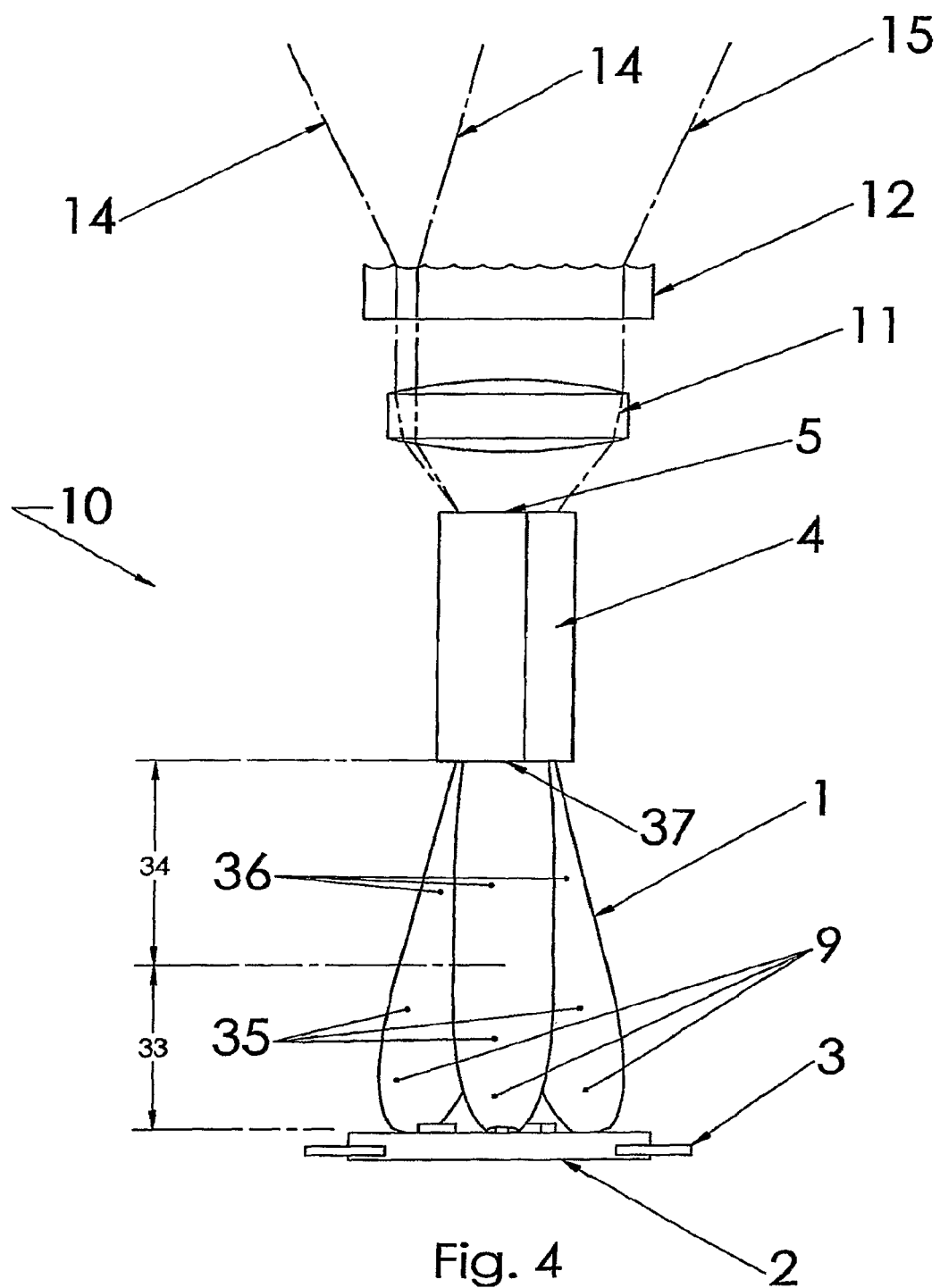
FIG. 4 is a side elevational view showing combination with optional optical elements of an LED package of the invention.

Turn now to the optical elements within LED package 10 as shown in FIG. 4. One of the optical elements is a reflector zone 33, whose centerline is disposed in an angled orientation of LED package 10. The light emitted from the LEDs 6, 7 or 8, passes through the reflector zone 33, either reflecting off the surface 35 of reflector zone 33 and/or surface 36 of combining chamber 34, or not. The aperture 37 of combining chamber 34 is sized to insure that essentially all or substantially all light emitted by the LEDs 6, 7 and 8 and reflected off of reflector zone surface 35 and reflected off the surface 36 of nearly cylindrical surface of combining chamber 34 is restricted to one-half the system angle requirement, which in the illustrated embodiment is no more than 15° off the perpendicular axis of symmetry of aperture 37 and LED package 10. Some of the light which reflects off the opposite wall of combining chamber 34 will not be within the system desired acceptance angle. It is estimated that not more than ten percent of the light emitted from aperture 37 will be outside the desired system acceptance angle.

It is to be understood that combining chamber 34 and the reflector zone 33 are such that the combining chamber 34 can be of almost any desired length including zero, and the reflector zone surfaces 35 can be arbitrarily long based on the requirements of the design. LEDs 6, 7, 8 may also be even more closely spaced at the cost of light collection efficiency and shortening of reflector zone 33.

The surface 35 of reflector zone 33 can be coated to reflect substantially all of the peripheral light from light emitting diodes, LEDs 6, 7 and 8, which is held in relative position of reflector lobe 9 by mechanical means, such as be adhesion to base 2 and fill of cavity 20 with an index-matching material. The design, form and function of reflector zone surfaces 35 may include any reflector geometry and technology now known or later devised. In the preferred embodiment, the reflector surface 35 is provided as a "Sally™" reflector, which is a proprietary term used defined for the purposes of this specification and its claims an LED reflector as described in copending U.S. patent application Ser. No. 11/093,988, filed Mar. 31, 2005, which is incorporated herein by reference.

LEDs 6, 7 and 8 are understood to include a semiconductor substrate in which the light emitting junction is defined, electrical leads, passivation layers and an optional protective dome mounted on or forming part of the passivating package around the emitter junction and substrate. The illustrated embodiment employs LEDs 6, 7 and 8, but it is to be understood that any light source as disclosed above.

It must also be understood that less or more than three LEDs 6, 7 and 8 may be combined in LED package 10 according to the foregoing teachings. The aperture 5 may incorporate a lens or lenses or other conventional optical surface that may be optionally provided to spread or converge the combined light beam, asymmetrically or not, or provide diffusion or other optical effects according to conventional design options. FIG. 4 shows optional lenses or prisms 11 and 12 that can be incorporated in a combined package of the invention. Such lenses can be used to facilitate light coupling into an optic fiber, collimating, spreading or otherwise controlling the light emanating from an LED package 10 of the invention. Lens 11 can also be combined with mechanical means for move the lens along its longitudinal axis to provide conventional zoom focusing for LED package 10.

The LED package 10 as shown by example in FIGS. 1-5 should not be taken as limiting the invention which extends to all types of reflector systems and color systems. For example, while the color system of the illustrated embodiment is red, blue, green, it is also possible to provide a "Munsell" light comprised of a system of red, blue, green, and amber or yellow with an appropriate four LED-reflector or optical system.

By selecting appropriate colored LEDs 6, 7 and 8 and controlling the output of the individual LEDs 6, 7 and 8, the LED package 10 can be color tuned for any appropriate application. In a preferred embodiment as shown in FIGS. 1-5, the LED package 10 is shown with three LEDs 6, 7 and 8. One of LEDs 6 is red, one 7 is green and one 8 is blue. The light from all three LEDs 6, 7 and 8 can then be considered as combined in the same physical space at the aperture 5. By separately adjusting the light output of the individual LEDs 6, 7 and 8 by means of any conventional LED drive circuit, in theory any color of light beam can be produced by the invention.

Turn now to FIG. 6 which shows an enlarged view of the LED 7 situated within the hemispherical portion 20 of a lobe 9 of optic 1. A preferred embodiment uses an optically clear material 19 to fill the hemisphere 20. It is also understood that the hemispherical zone 20 could be left unfilled or the LED 7 could have its own encapsulant and be bonded or not to the optic 1. It must be understood that LED 7 thus could contemplate a protective dome or other passivating subpackage or could be an unprotected chip.

FIGS. 7 and 8 describe the addition of housing or cover 21 to LED package 10 creating a protected package 30. Package 30 may thus in one embodiment comprise three components, optic 1 with integrator rod 4 as a single monolithic body, a base 2 and a protective housing 21 which are bonded or welded together. The figures also describe the use of an integrated optical surface 22 on aperture surface 5. In addition to surface 22 being a refracting lens, it could take any form and provide any optical processing now known or later devised, including but not limited to a diffusing surface, a scattering surface, a diffracting surface using any kind of surface coating, preparation or patterning.

Hence, it can now be appreciated that the invention provides an electronically controllable colored light source which is physically compact and provides a single, selectively controllable, colored beam of light with a minimum of the number of optical elements and reflective surfaces and a minimum optical path length.

Figure 9:
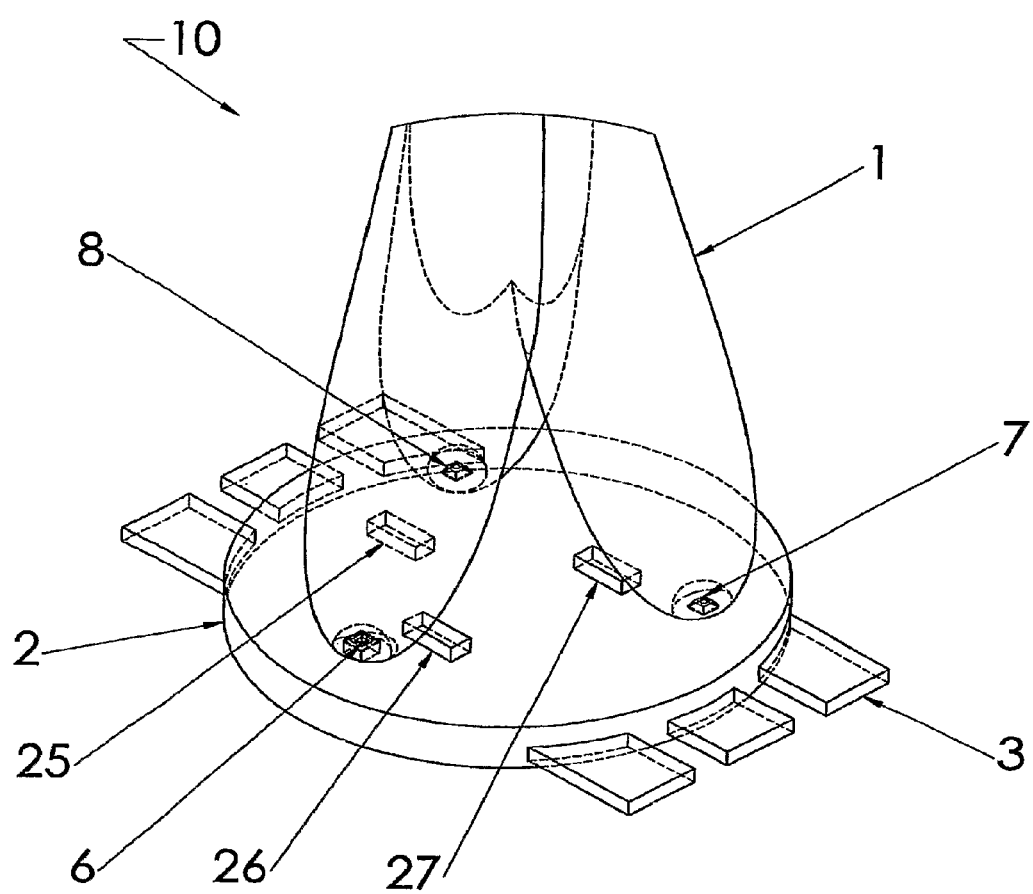
FIG. 9 is an enlarged perspective transparent view of the lower end of an embodiment of the invention further detailing additional electronic components.

The resultant LED packaging 30 of the illustrated invention shares some attributes with conventional LED packaging, but also extends it to a more complex and efficient optical system. FIG. 9 shows the addition of several electronic components 25, 26 and 27. These represent the addition of circuitry and or electrical components to LED packages 10 and 30 which could be of almost any configuration that would allow further control of the LEDs 6, 7 and 8. One such example for circuits 25, 26, and 27 are photodetectors that could be used to evaluate the output of individual LEDs 6, 7 and 8 and provide corrective or intelligent information to the circuits that drive the LEDs 6, 7 and 8. Another use of circuits 25, 26, and 27 in the package 10, 30 could be the addition of protective diodes that would keep the system working even when an LED 6, 7 and 8 fails. The drive circuitry and/or resistors for the LEDs 6, 7 and 8 could be provided to allow them to operate without additional circuits.

Figure 10:
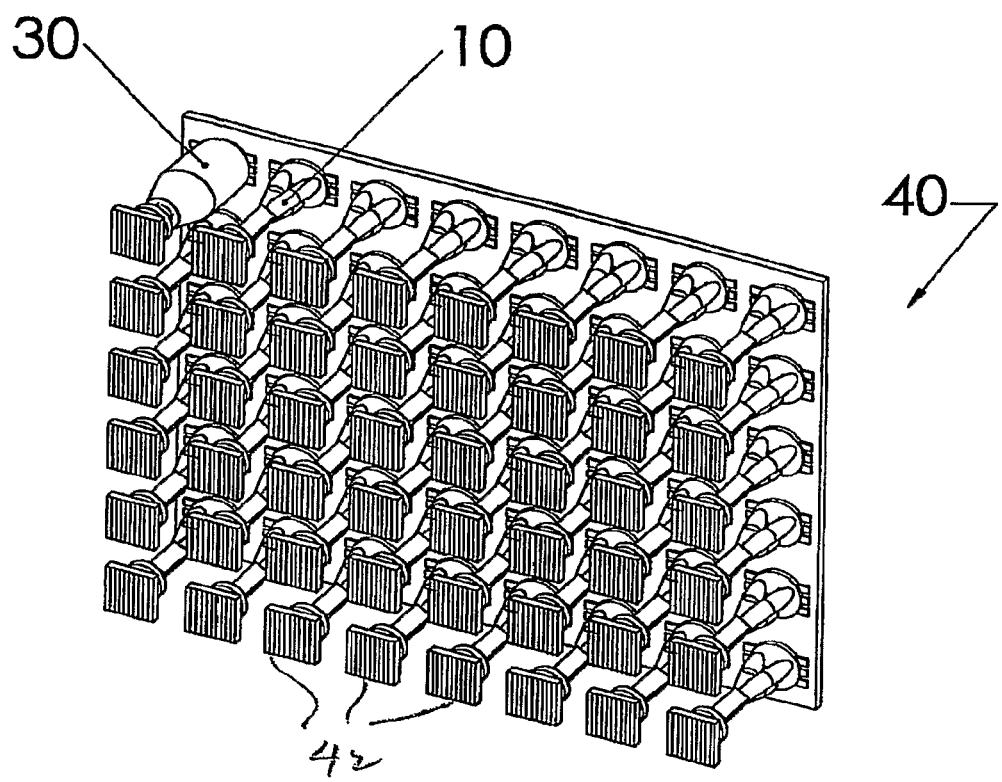
FIG. 10 is an array of any one of the various embodiments of the miniature LED packages combined into an array and provided with an optical termination on each of the miniature LED packages.

The invention has been illustrated in the context of a simple three LED device, but the principle of the invention can be extended as shown in FIG. 10 to a micromachined (MEMS) array 40 of integrated versions of LED package 10, where each pixel of a display is a micromachined LED package 10 and where the display becomes a color key representation of any kind of information desired, such as a colored contoured or field map of any two or three dimensional object or parameter of interest representing anything from navigational topology maps to real time spatial distributions of brain functions.

FIG. 10 shows an array 40 of LED packages 10 and 30 of the invention. An array 40 can have either individual secondary optics, or secondary optics 42 that span several or all of the LED packages 10 and 30. Again optic 42 may be any kind of optic element as might be desired, such as refraction lenses, prismatic lenses, diffusing plates, filters, prisms and any kind of optically processing element now known or later devised. The array 40 can be used for panel lighting, such as would be used for backlighting an LCD screen, semi-translucent panel or similar device. An array 40 can be used as the pixels for a large area video display, such as those used in stadiums and for indoor or outdoor advertising displays. In this capacity the LED package becomes the desired "white pixel" for the large area video display marketplace, such that all the colors emanate from a single aperture, not individual Red, Green and Blue dots as in the prior art which are merged only by the limits of resolution of the human eye at a distance. This single "white pixel" is very advantageous for close-up and off axis viewing as well as overall video quality. By combining the colors into an efficient, small package, the array can have very low "pixel pitch" or increased resolution per metric, usually, pixels per inch.

Figure 11:
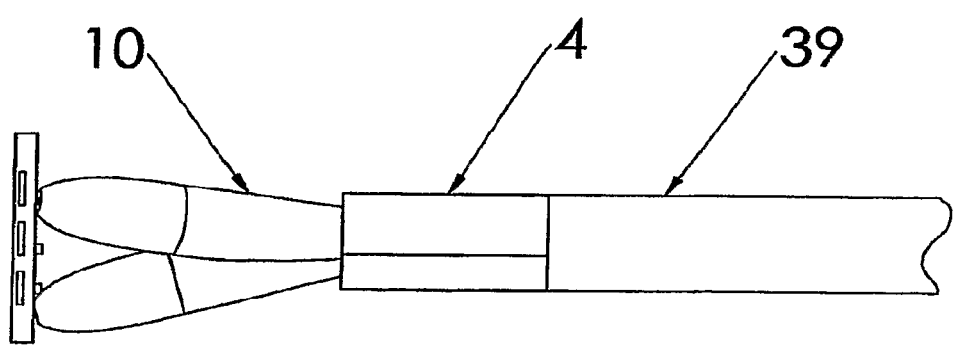
FIG. 11 is a side plan view of an embodiment of the invention wherein an integrator rod and optic fiber are combined.

FIG. 11 shows an LED package 10 of one embodiment of the invention positioned to provide its energy into a fiber optic cable 39 through an optional integrating rod 4. There are many uses for the LED package as a "fiber engine", far too many to enumerate here, but some are: medical—to illuminate endoscopes, either disposable or not; medical—to illuminate tools and equipment; medical—to provide UV for curing adhesives; entertainment—to provide colored lighting for almost any venue; automotive, to provide color changing light to the dashboard or other components of the automobile; aircraft and marine panel and instrument lighting; and the like virtually without limit.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. An LED package having a common aperture with an axis normal to a plane in which the common aperture lies comprising:
   a base;
   a plurality of light emitting diodes (LED) of similar or differing wavelengths mounted on the base; and
   a body mounted on the base comprised of:
      a corresponding plurality of reflector zones coupled to the plurality of LEDs for collecting light radiated from the plurality of LEDs and forming a corresponding plurality of beams directed along a corresponding optical axis of the reflector zones; and
      a combining chamber zone coupled to the plurality of reflector zones for combining the light of the plurality of beams into a unitized beam across the common aperture with most of the light in the unitized beam lying with a predetermined acceptance angle of the axis of the common aperture; and
   an integrating rod coupled to the common aperture of the combining chamber and defining an output aperture.

2. The LED package of claim 1 further comprising a plurality of heat sinks, each heat sink thermally coupled to a corresponding one of the plurality of LEDs for providing thermal management of the LED.

3. The LED package of claim 1 where ones of the plurality of LEDs generate differing wavelengths and further comprising a corresponding plurality of circuits disposed into or on the base, each circuit coupled to a corresponding one of the plurality of LEDs for selectively controlling a composite color of light of the unitized beam provided across the common aperture.

4. The LED package of claim 1 where the plurality of LEDs comprise at least two LEDs, at least two corresponding reflector zones, each having a focal point, a common combining zone communicated to the at least two corresponding reflector zones, at least two corresponding cavities, each defined in each of the reflector zones for receiving the LEDs at or near the focal point of the reflector zone, and an optical index-matching filler material filling the cavity between the LED and the reflector zones.

5. The LED package of claim 4 where the LED has a nearly hemispheric radiation pattern and where each of the plurality of reflector cavities is optimized for collection of light from the nearly hemispheric radiation pattern of the corresponding LED, and is arranged and configured to provide a corresponding beam that is substantially within the predetermined acceptance angle at the common aperture.

6. The LED package of claim 4 where each reflector zone comprises a conic shape and is faceted, dimpled or modified to provide a desired beam pattern or a Sally reflector surface.

7. The LED package of claim 4 where the combining chamber is a nearly cylindrical reflective zone which directs light to the common aperture.

8. The LED package of claim 7 where the plurality of LEDs comprise three LEDs, where the plurality of reflectors comprise three corresponding reflective cavities symmetrically inclined about the axis of the common aperture and where the nearly cylindrical reflective zone has a length which allows the energy of each reflector zone to reach the common aperture with substantially all of the energy of the corresponding beam within the predetermined acceptance angle.

9. The LED package of claim 1 where the plurality of reflectors and combining chamber are provided within a monolithic TIR body, the common aperture being defined on a surface of the monolithic TIR body.

10. The LED package of claim 1 further comprising a protective housing in which the plurality of LEDs, reflectors and combining chamber are enclosed, a circuit disposed with the base, at least an LED driver circuit coupled to each LED disposed on the base and coupled to a corresponding one of the plurality of LEDs, and a heat sink thermally coupled to the base.

11. The LED package of claim 1 further comprising a modulation circuit for separately driving each of the plurality of LEDs according to a corresponding control signal.

12. The LED package of claim 11 where the modulation circuit has an audio input signal with a frequency spectrum and generates a plurality of output signals corresponding to the plurality of LEDs in which signal input within selected portions of the frequency spectrum of the audio input signal is used to derive corresponding ones of the plurality of output signals.

13. The LED package of claim 12 where the modulation circuit generates the plurality of output signals with an intensity of each of the output signals correlated to a predetermined measure of the intensity of input signal within selected portions of the frequency spectrum.

14. The LED package of claim 13 where the modulation circuit generates the plurality of output signals in response to a musical input signal.

15. The LED package of claim 11 where the modulation circuit has an audio input signal and where the modulation circuit comprises a signal processing circuit to generate processed audio output signals corresponding to the audio input signal.

16. The LED package of claim 11 where the modulation circuit has an audio input signal and where the modulation circuit comprises a signal processing circuit to generate processed audio output signals corresponding to the audio input signal.

17. The LED package of claim 11 where the modulation circuit has an input signal corresponding to an information-bearing signal and where the modulation circuit comprises a signal processing circuit to interpret the information in the information-bearing signal and to generate selectively responsive output signals to drive the plurality of LEDs.

18. The LED package of claim 1 further comprising a heat sink thermally coupled to the base and comprised of a heat conductive material and where LEDs are mounted on the heat conductive material to provide the thermal management for the LEDs.

19. The LED package of claim 1 where the integrating rod further comprises an optical element coupled to the output aperture.

20. The LED package of claim 1 or 19 further comprising an optic fiber coupled to the integrating rod or optical element.

21. An array of LED packages of claim 1 comprising a plurality of the LED packages combined into a pixel array.

22. The array of claim 21 further comprising an optical element coupled to each of the LED packages.

23. The array of claim 21 where each of the LED packages comprises a miniature LED package.

24. The array of claim 23 where each of the miniature LED packages comprises a MEMS LED package.

25. The LED package of claim 1 where the common aperture comprises a color tunable white pixel without phosphors.

26. A miniature LED package having a common aperture with an axis normal to a plane in which the aperture lies, the miniature LED package for providing a selected color of light to a fiber having an optical axis comprising:
  a base;
  a plurality of light emitting diodes (LEDs) mounted on the base, each LED with a predetermined wavelength;
  a body comprising:
    a corresponding plurality of reflectors coupled to the LEDs for collecting light radiated from the plurality of LEDs and forming a corresponding plurality of beams directed along a corresponding optical axis of the reflector; and
    a combining chamber coupled to the plurality of reflectors for combining the light of the plurality of beams into a unitized beam across the common aperture with most of the light in the unitized beam lying with a predetermined acceptance angle of the axis of the common aperture; and
  an integrating rod coupled to the body defining an output aperture,
  wherein the fiber is optically coupled to the common aperture of the miniature LED package and where the axis of the common aperture is approximately aligned with the optical axis of the fiber, the predetermined acceptance angle being determined by an acceptance angle of the fiber.

27. A miniature LED package having a common aperture with an axis normal to a plane in which the aperture lies, the miniature LED package for providing a selected color of light to a fiber having an optical axis comprising:
  a base;
  a plurality of light emitting diodes (LED) mounted on the base, each LED with a predetermined wavelength;
  an optic body comprising:
    a corresponding plurality of reflectors coupled to the plurality of LEDs for collecting light radiated from the plurality of LEDs and forming a corresponding plurality of beams directed along a corresponding optical axis of the reflector;
    a combining chamber coupled to the plurality of reflectors for combining the light of the plurality of beams into a unitized beam across the common aperture with most of the light in the unitized beam lying with a predetermined acceptance angle of the axis of the common aperture;
  an integrating rod coupled to the body defining an output aperture; and
  a plurality of tone activated LED drivers, each driver being electrically coupled to a corresponding one of the plurality of LEDs,
  wherein the fiber is optically coupled to the common aperture of the miniature LED package and where the axis of the common aperture is approximately aligned with the optical axis of the fiber, the predetermined acceptance angle being determined by an acceptance angle of the fiber.

* * * * *